United States Patent [19]
Engstrom

[11] 3,978,474
[45] Aug. 31, 1976

[54] KEYBOARD WITH N-KEY LOCKOUT AND TWO-KEY ROLLOVER PROTECTION

[75] Inventor: Keith Allen Engstrom, Arlington Heights, Ill.

[73] Assignee: Illinois Tool Works Inc., Chicago, Ill.

[22] Filed: July 15, 1975

[21] Appl. No.: 596,560

[52] U.S. Cl. .................... 340/365 E; 340/174 PM
[51] Int. Cl.² ........................................ G08C 25/00
[58] Field of Search ..................... 340/365 E, 365 S

[56] References Cited
UNITED STATES PATENTS

| | | | |
|---|---|---|---|
| 3,816,826 | 6/1974 | Masuda | 340/365 E |
| 3,918,051 | 11/1975 | Bernin | 340/365 E |

*Primary Examiner*—Thomas B. Habecker
*Attorney, Agent, or Firm*—G. W. Bowen; R. W. Beart

[57] ABSTRACT

A keyboard having N-Key Lockout and Two-Key Rollover Protection is disclosed. Each key switch of the keyboard is assigned a unique time slot in a scan cycle. A key switch actuation results in a logic "1" signal at the input of a shift register which is shifted to the output of the shift register one scan time later. Comparison of the input and output states of the shift register results in a signal which indicates when any key switch has not been actuated during the last scan cycle in order to reset a flip-flop which produces a strobe pulse to external data processing equipment. A modulus 2 counter, and other associated circuitry, inhibits the strobe pulse whenever two key switches are actuated during the same scan cycle.

15 Claims, 8 Drawing Figures

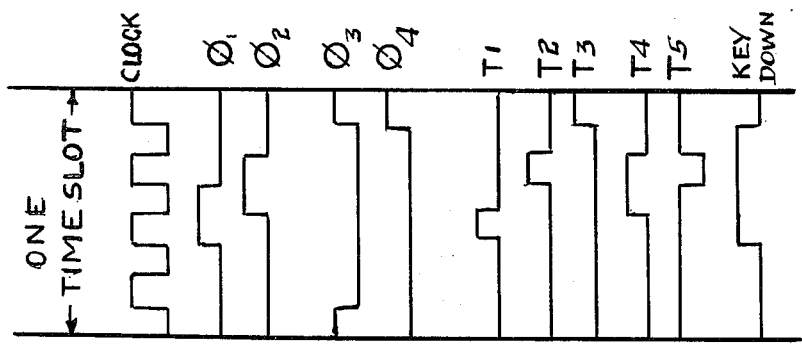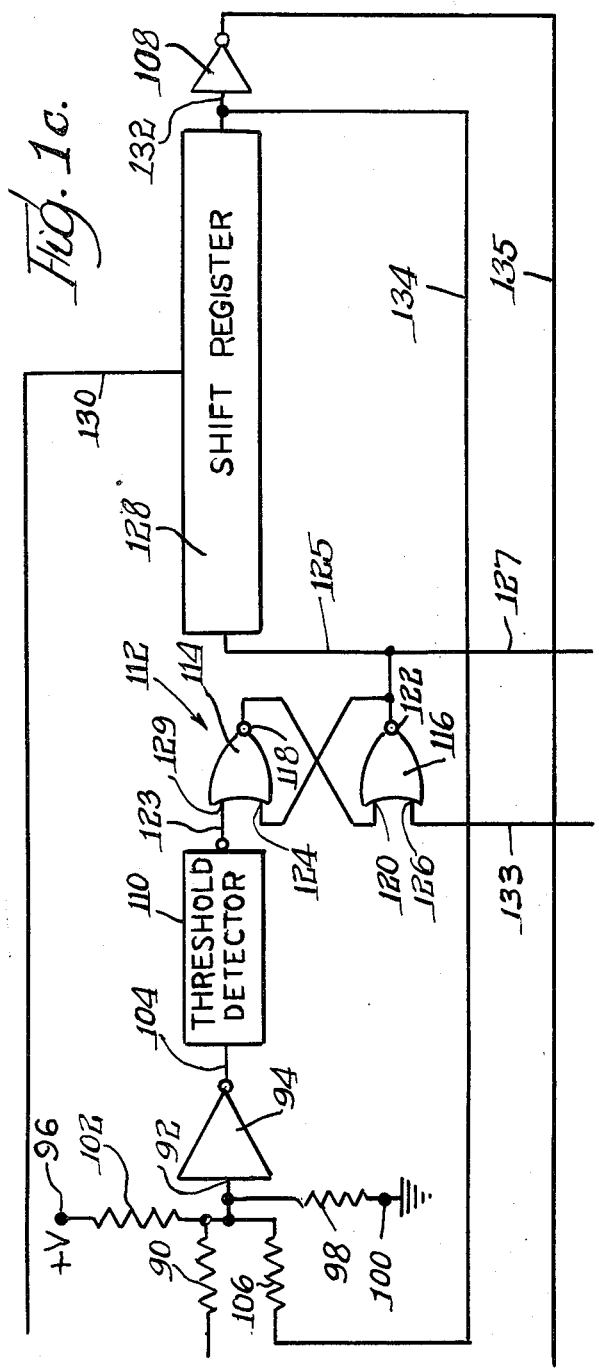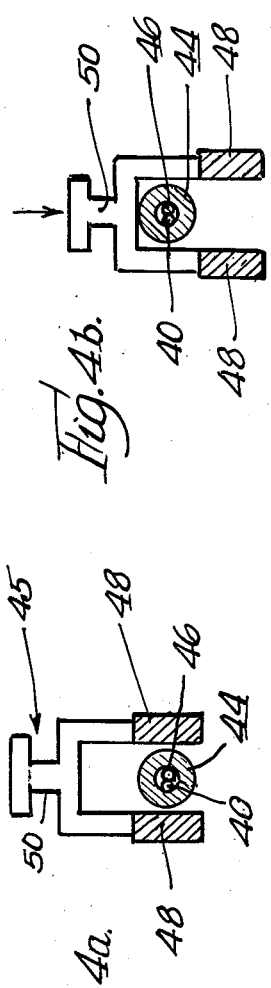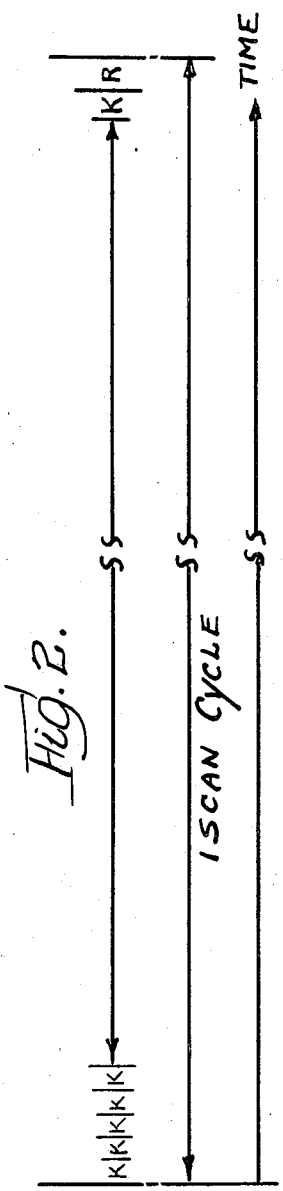

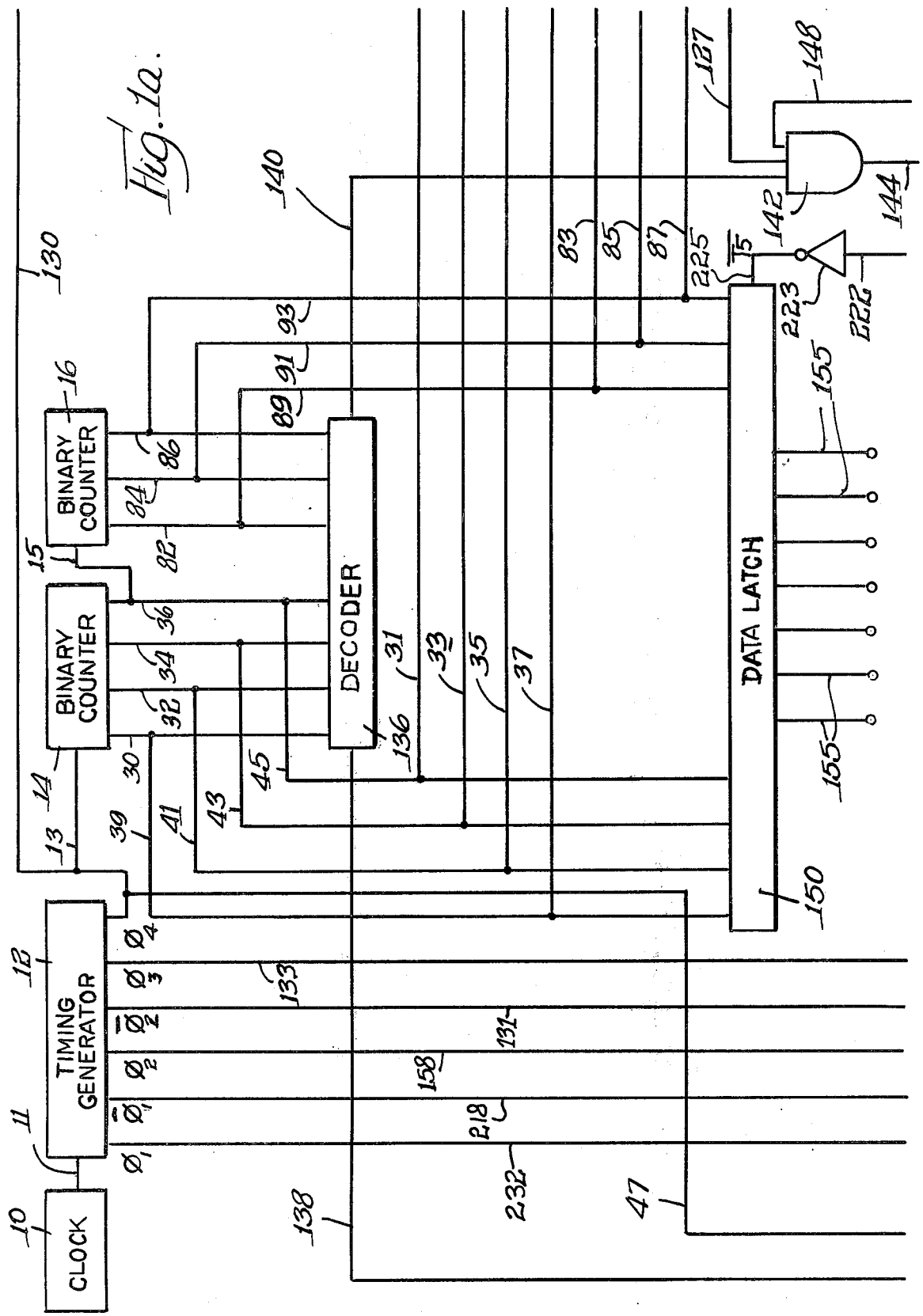

KEYBOARD WITH N-KEY LOCKOUT AND TWO-KEY ROLLOVER PROTECTION

BACKGROUND OF THE INVENTION

The present invention relates to a scanned keyboard for entering data and function instructions into remote data processing equipment. The keyboard is formed with a matrix of key switches which are scanned so that any actuated key switch of the keyboard will result in the transmission of a unique code for that key switch. The transmitted code for an actuated key switch occurs at a unique time slot in the keyboard scan cycle.

The construction details of the suitable key switches, or selectors, which may be used in conjunction with the keyboard design of the present invention are disclosed in United States Patent Application, Ser. No. 525,416 filed in the name of Victor M. Bernin, Robert Madland and Carl Knoll on November 20, 1974 and assigned to the assignee of the present invention.

The keyboard of the present invention employs a keyboard encoder array which scans the key switches of the keyboard matrix in successive scan cycles that are appreciably shorter in duration than the fastest anticipated time delay between the manual operation of two successive key switches. Certain errors may occur in the operation of keyboard entry systems during rapid burst typing of familiar groups of letters, such as "and", "the", and the suffix "ing". Construction details of an N-Key Rollover Protection System to eliminate these errors, which uses a shift register and a comparator, may be found in the patent application of Keith A. Engstrom, United States Patent Application, Ser. No. 457,884 filed April 4, 1974, which is assigned to the assignee of the present invention. An N-Key Rollover Portection System allows the transmission of the code for a given key switch upon the depression of that key switch regardless of the state of any other key switch in the keyboard matrix. A key detect signal is generated in the N-Key Rollover Protection System of the prior Engstrom application for each new actuation of a key switch, and thus, the letters $t$, $h$ and $e$ of the word, "the" will be read out as they are sequentially actuated.

The N-Key Rollover Protection System is constructed in the keyboard of the prior Engstrom application by use of a shift register, which has a number of stages that are equal to the maximum number of key switches in the keyboard matrix, and a comparator. The output of the shift register, which represents the state of a particular key switch during the last scan cycle, is compared with the state of the key switch during the present scan cycle, and the comparator indicates whether or not the same key switch has been actuated during two successive scan cycles. If the key switch has been held down during two successive scan cycles a key detect signal will not be generated for this particular key switch, but it will be generated upon the initial actuation of another key switch, thus providing the desired N-Key Rollover Protection System.

While an N-Key Rollover Protection System is very desirable for keyboards in which burst entry typing may occur, the electronic keyboard industry standard for the prevention of false code errors has generally been the N-Key Lockout/Two Key Rollover System; and some users prefer this type of system for particular applications. N-Key Lockout permits a code for a given key switch to be transmitted from the keyboard only if that key switch is the only key switch of the keyboard which is depressed over a given time. Two-Key Rollover provides that the code for a given key switch will be transmitted only once for each actuation of the key switch. In this type of system the depression time, for example, between the letter $t$ and the letter $h$ during the typing of the word, "the" may overlap; and if the letter $e$ is next actuated so that both of the letters $h$ and $e$ are actuated during the same time period, the letter $h$ may not be transmitted with a N-Key Lockout/Two Key Rollover scheme because there may never be a time when it is the only actuated key switch. An N-Key Lockout/Two Key Rollover System does have the advantage, however, that when more than two coded key switches are actuated in the same scan cycle no key switch code will be transmitted. Both the N-Key Rollover Protection System of the prior mentioned Engstrom application and the N-Key Lockout/Two Key Rollover Protection System of the present application may utilize the same shift register and comparator, if desired, thereby reducing the number of different types of circuit boards required by a keyboard manufacturer who produces both types of protection systems.

DESCRIPTION OF THE DRAWINGS

The present invention is described by reference to the drawings in which:

FIGS. 1a – 1d show a block diagram representation of the keyboard system of the present invention;

FIG. 2 is a diagrammatic chart which shows the scan cycle of the present invention with its key switch and update time slots;

FIG. 3 is a timing chart which shows various pulse signals that are generated in the keyboard system of FIGS. 1a – 1d during one key time slot K or one update time slot R; and FIGS. 4a and 4b diagrammatically show one representative key switch in its unactuated and actuated states, respectively, which may be used with the system of present invention.

TECHNICAL DESCRIPTION OF THE INVENTION

Figure 1B:
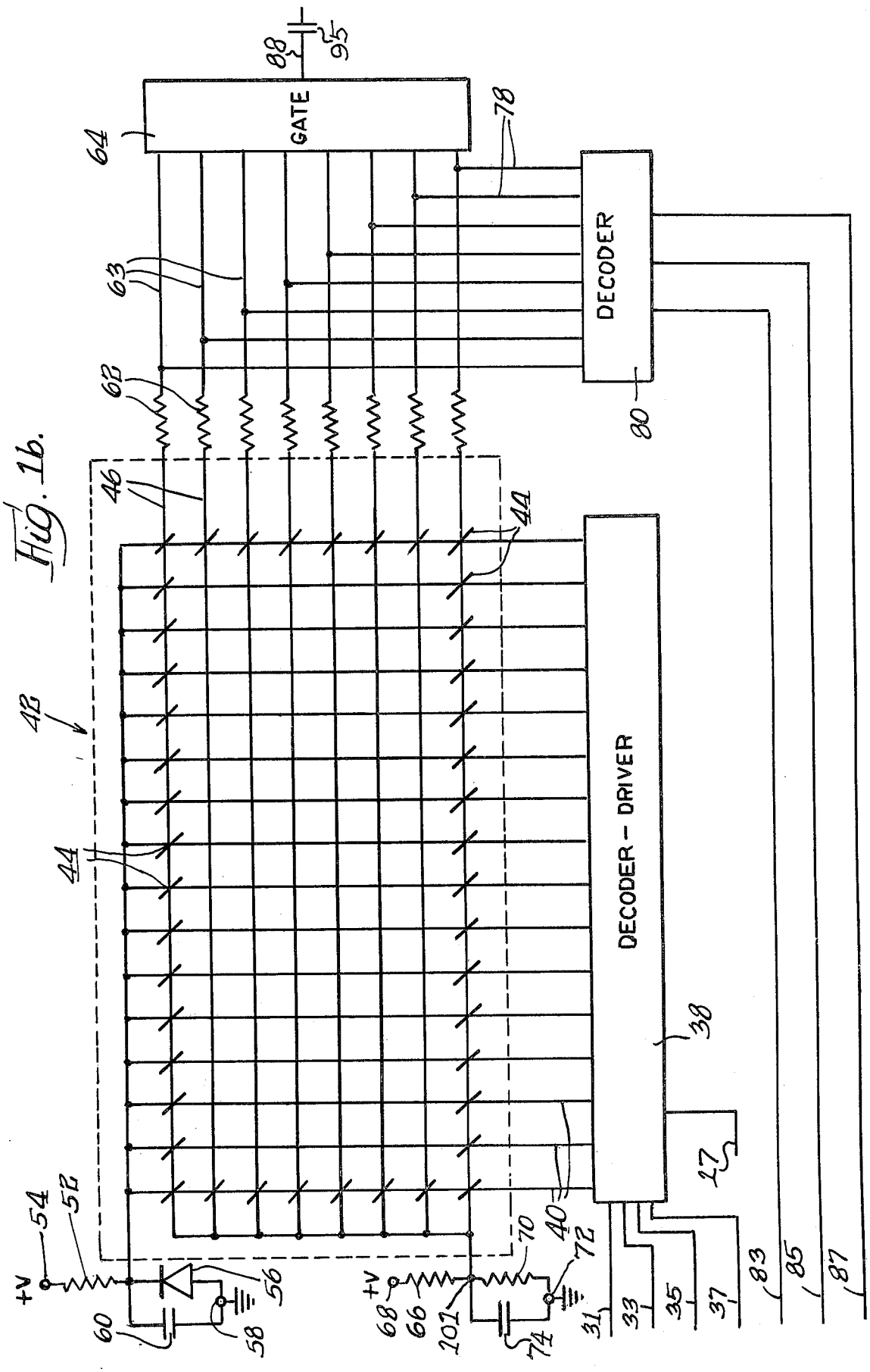

A block diagram of the system of the present invention is shown in FIGS. 1a – 1d. These figures may be placed together so that corresponding numbered conductive lines are connected to form a complete block diagram of the system. Timing pulses for controlling the system are initiated by a master clock generator 10, the output of which feeds a timing generator 12 on the output line 11. The timing generator 12, in turn, has its last stage coupled on the line 13 to the input of a four-stage binary counter 14 which has its last stage coupled to the input of a three-stage binary counter 16 over the connecting line 15. The clock 10 produces a continuous clock voltage pulse train which is shown in FIG. 3. The timing generator 12 consists of a counter which corresponds to the clock pulse train to produce the timing phases $\phi_1$ - $\phi_4$ that are related to each other and to the clock pulse train as shown in FIG. 3. In addition, the logical inverse signals $\overline{\phi_1}$ and $\overline{\phi_2}$ (not shown) of the signals $\phi_1$ and $\phi_2$ are also produced by the timing generator 12.

The output signal of the timing generator 12, which is coupled to the binary counter 14 on the line 13, is used as an input to the binary counter 14 which counts the number of times that the $\phi_4$ signal is generated and produces a corresponding binary count output. As mentioned, the last stage of the binary counter 14 is coupled to the binary counter 16 on the line 15 and, thus, for every sixteen pulses of the $\phi_4$ signal that are received at the input of the binary counter 14, one output pulse will be coupled to the input of the binary counter 16. The binary counter 16 is a three-stage which counts up to eight input pulses from the binary counter 14 and therefore, the binary counters 14 and 16 may count a total of 128 occurrences of the $\phi_4$ signal. The counters 14 and 16 are constructed so as to reset upon reaching their respective full count capacities.

The four stages of the binary counter 14 are coupled to the output lines 30, 32, 34 and 36, which are in turn connected to the output lines 39, 41, 43 and 45. These lines respectively supply the count in the binary counter 14 to the decoder 136 and to the data latch 150. The lines 31, 33, 35 and 37 are connected to the lines 39, 41, 43 and 45, respectively, so as to supply to count in the binary counter 14 to the decoder-driver 38. The drive lines 40 that are coupled to the decoder-drive 38 form the drive lines up to 128 toroidal-shaped magnetic cores 44 of the keyboard switch matrix 42. Each of the torodial cores 44 is threaded with one of the drive lines 40 and a corresponding one of the sense lines 46. Only a few of the cores 44 are depicted in FIG. 1b; it being understood that a core may be placed at each of the intersections of the drive lines 40 and the sense lines 46, if desired.

The drive line 40 and the sense line 46 at each core location in the matrix 42 act as a transformer so that when a current pulse is applied on the drive line 40 it will be transformed into a voltage pulse on the sense line 46 as long as the core 44 at this location is not magnetically saturated. The count in the counter 14 is decoded by the decoder-driver 38, which results in current flow to only one of the drive lines 40 of the matrix 42. The $\phi_1$ signal on the line 17, which is connected to the line 232 that is supplied the $\phi_1$ signal from the timing generator 12, is used to gate the decoder-driver 38 at the proper time. The decoder-driver 38 thus provides a sequential scan of the sixteen drive lines 40 of the matrix 42.

Each of the cores 44 is associated with a unique key switch in the keyboard which may be of the type illustrated diagramatically in FIGS. 4a and 4b. This key switch may specifically be of the type mentioned in the Bernin et al patent application, Ser. No. 525,416; and this application is hereby incorporated by reference into the present application. The unactuated position of the key switch (or key for short), is shown in FIG. 4a wherein the core 44 is disposed intermediate a pair of permanent magnets 48 which substantially magnetically saturate the core 44 when the key switch 45 is not actuated by the depression of the key button, 50. When the core 44 is magnetically saturated, there is no substantial transformer coupling between the drive line 40 and the corresponding sense line 46. However, when the key button 50 is depressed, the permanent magnets 48 move down away from the core 44, as shown in FIG. 4b, and the core 44 then becomes magnetically unsaturated, thereby allowing current pulses flowing through the drive line 40 to be transformed into voltage pulses on the sense line 46.

The drive lines 40 are all connected to the junction point of the resistor 52 and the diode 56, the anode of which is connected to the grounded terminal 58. One end of the resistor 52 is connected to the terminal 54 which has a positive voltage source connected to it while the other end of the resistor 52 is connected to the cathode of a diode 56. A storage capacitor 60 is coupled across the diode 56 to provide a high current surge for a short duration through the drive line 40 that is grounded by the decoder-driver 38 until the capacitor 60 discharges. The current through the resistor 52 is small when compared to the current from the capacitor 60 during discharge of the capacitor. When a key switch 45 is simultaneously depressed at the time that a current is flowing through a drive line 40 a signal pulse will be transformed from the drive line to the corresponding sense line 46. The diode 56 eliminates negative going excursions of the pulse that is supplied to the drive lines 40. The off time of the $\phi_1$ signal on the gating line 17 to the decoder-driver 38 allows the storage capacitor 60 time to reach the positive voltage potential at the terminal 54 after each pulse of current through a grounded drive line 40.

One end of each of the sense lines 46 is coupled through a separate resistor 62 to a multiple input analog OR gate on the input lines 63. The other ends of the sense lines 46 are coupled to the junction point 101 of the resistors 66 and 70, which are smaller in value than are the resistors 62. One end of the resistor 66 is connected to the terminal 68, which is coupled to a positive voltage supply, and one end of the resistor 70 is coupled to the grounded terminal 72. A bypass capacitor 74 is coupled across the resistor 70 to the junction point 101 of the resistors 66 and 70 to provide a low A.C. impedance to the grounded terminal 72.

The input lines 63 to the gate 64 are also connected to the output lines 78 of the decoder 80. Thus, as long as a given output line 78 is held at a low, or approximately ground, potential by the decoder 80, any voltage superimposed on the voltage already present on the corresponding sense line 46 as a result of a key switch actuation will not supply current to the input of the gate 64. In order for a particular core 44 of the matrix 42 to produce an output signal on the output line 88 from the gate 64, it is necessary that three conditions be met;

a. A key button 50 of a key switch 45 must be depressed to unsaturate the corresponding core 44;

b. The particular drive line 40 associated with the unsaturated core 44 must be grounded by the decoder-driver 38 to allow a current pulse to flow through it; and c. The particular decoding line 78 from the decoder 80 which is associated with the corresponding sense line 46 for the actuated key switch 45 must be enabled by the decoder 80 so that a positive voltage approximately equal to the voltage at the junction point 101 is applied to the end of the resistor 62 which is coupled to the input of the gate 64. This allows current to pass into the input of the gate 64 through the corresponding resistor 62 and sense line 46 when the voltage due to the actuated key switch is superimposed on the associated sense line 46.

The binary counter 16 has three output lines 82, 84 and 86 which are coupled to the decoder 136. Three other output lines 89, 91 and 93 are respectively connected to the output lines 82, 84 and 86 to supply the count in the binary counter 16 to the data latch 150. In addition, three other output lines 83, 85 and 87 are connected respectively to the output lines 89, 91 and 93 to supply the count in the binary counter 16 to the decoder 80. These output lines are energized incrementally in a consecutive manner each time the output of the binary counter 14 on the line 15 goes to a count of zero. In this manner, the sixteen counts of the binary counter 14 in combination with the eight counts of the binary counter 16 are able to provide a total count of 128, which is equal to the maximum number of magnetic cores 44 in the matrix 42 of the described embodiment. The eight output lines 78 of the decoder 80 and the sixteen drive lines 40 of the decoder-driver 38 are, therefore, able to provide for the unique sensing of all of the cores 44 in succession, with each key switch of th matrix 42 having a unique time slot in the scan cycle, during which time it may be sampled so that a signal will be provided to the gate 64 following actuation of the corresponding switch.

The timing diagram of FIG. 2 shows the time period of one complete scan cycle of the keyboard. The period of the scan cycle is typically on the order of one to four milliseconds, and for the illustrated embodiment it is divided into 127 key slots, K, of equal duration, and an update time slot, R, which preferably is equal in duration to the key time slot K. The update time slot, R, may occur only once per scan cycle. The update time slot R may be associated with one unstrobed key switch of the matrix 44, thereby allowing for 127 strobed, or data key switches, plus one unstrobed, or function key switch, for a total of 128 key switches for the described embodiment. The described version of the present invention utilizes four clock phases from the master clock 10 per time slot, as shown in FIG. 3.

The output line 88 of the OR gate 64 is coupled through a coupling capacitor 95 and the resistor 90 to the input terminal 92 of an inverting amplifier 94. A second input resistor 106 has one end coupled to the input terminal 92 and its other end coupled to the input of an inverter 108. A third resistor 98 is connected between the input terminal 92 and the grounded terminal 100 and a fourth resistor 102 is connected between the input terminal 92 and the terminal 96 which is coupled to a positive voltage supply. Prior to the actuation of any of the key switches 45, the output of the shift register 128 will be at a logic 0 level, and, thus, a current sink is formed through the resistor 106. This provides a relatively high threshold level for any key switch-generated signal that passes through the resistor 90 at this time because of the current drain that occurs away from the input terminal 92 through the resistor 106.

The output line 104 from the amplifier 94 is coupled to the input of a conventional signal inverting threshold detector 110 to provide a logic level signal to the flip-flop 112 which is employed in order to increase and to make uniform the duration of the pulse that is supplied on the output line 123 from the threshold detector 110. The flip-flop 112 is made up of two NOR gates 114 and 116. The output terminal 118 of the NOR gate 114 is cross-coupled to one input terminal 120 of the NOR gate 116; while the output terminal 122 of the NOR gate 116 is cross-coupled to one input terminal 124 of the NOR gate 114. The output line 123 from the threshold detector 110 is connected to the input terminal 129 of the NOR gate 114, while the reset input 126 of the NOR gate 116 is connected to receive the $\phi_3$ signal from the timing generator 12 on the line 133.

The output terminal 122 of the NOR gate 116 is supplied on the output line 125 to the input of the 128 bit serial shift register 128 and on the line 127 to one input of the AND gate 142. A logic 0 is initially shifted through all of the stages of the shift register 128 when power is first applied and no key switches are actuated. Upon the actuation of a key switch 45 in the matrix 42, the first stage of the shift register 128 is presented with a logic 1, and this is shifted one stage at a time toward the output of the shift register 128 under the control of each successive pulse of the $\phi_4$ signal on the line 130.

Since all of the stages of the shift register 128 ae initially in a logic 0 state, the last stage of the shift register initally provides a logic 0 on the output line 132, and this causes the output of the inverter 108 which is applied on the output line 134 to initially be at a logic 1 level. As previously mentioned, this provides a current sink for current flowing through the resiistor 106 away from the input terminal 92 of the amplifier 94 so as to effectively provide a high input threshold level at this point. The logic 1 level signal on the input of the shift register 128 when a key is actuated is shifted to the output stage of the shift register 128 and appears on the output lines 135, 134 one scan cycle period later from its appearance on the input line 125. The input resistor 106 to the amplifier 94 then no longer has any substantial amount of current flowing through it since the stage of the shift register is at a logic 1 level and, therefore, the input thershold for the amplifier 94 will be effectively lowered because more input current to the amplifier 94 is available. The purpose of this "hystersis feedback" path is to avoid an erroneous multiple output signal that could otherwise result from a "teasing" of a key switching the absence of such a path. This is accomplished since the reduced threshold level acts to prevent noise signals from erroneously driving the amplifier 94 off while the actuated key switch remains depressed.

The output signal from the flip-flop 112 on the lines 125, 127 indicates when a key switch 45 of the matrix 42 has been actuated and that its particular time slot in the scan cycle has been reached. This output signal on the lines 125, 127 is represented by the "key down" pulse signal of FIG. 3. It is noted that the "key down" signal goes to a logic 1 level substantially coincidentally with the rise of the $\phi_1$ signal on the line 232 from the timing generator 12 and that it remains at a logic 1 level until the $\phi_3$ clock signal on the line 133 changes to a logic 1 level, at which time the flip-flop 112 is reset so that the "key down" signal on the lines 125, 127 changes to a logic 0 level signal.

The output lines 30–36 of the binary counter 14 and the output lines 82–86 of the binary counter 16 are all coupled to the decoder 136. The decoder 136 decodes the counts of the binary counter 14 and 16 and produces a logic 1 output signal on the line 138 whenever the count of the counters 14 and 16 have reached a count of 128, which signifies that a scan cycle of the keyboard has been completed. A logic 1 level signal on the line 138 thus occurs only once during each scan cycle.

The matrix 42 in addition to providing coded data may also provide a function code data for directing the interaction of remote data processing equipment with the keyboard. In order to accomplish this, certain locations of the matrix 42 may be reserved for function key switches, each of which will be associated with either a K time slot or with a R time slot. When an actuated function key switch isdetected, the N-Key Lockout/Two Key Rollover Protection circuitry of the present invention will be ineffective for this particular key switch. The location of the function key switches are also decoded by the decoder 136 but a logic 0 level signal appears on the output line 140 whenever a function key is decoded, while a logic 1 level signal appears on this line whenever an actuated data key switch is decoded. The output line 140 of the decoder 136 is connected to one input of the AND gate 142, the output of the AND gate 142, the output of which appears on the line 144. A second input to the AND gate 142 is derived from the "key down" signal on the line 127 which is coupled to the output of the NOR gate 116 of the flip-flop 112. A third input of the AND gate 142 is derived from the line 138 through the inverter 146 so as to provide a signal on the line 148 that indicates when the scan cycle is in a key switch, or K time slot. A logic 1 level signal that may be termed a "data key" signal, therefore, appears on the output line 144 of the AND gate 142 when a data key switch of the matrix 142 is being actuated and the scan cycle is in a key switch time slot K.

The counts of the binary counter 14 and 16 are also supplied on the lines 39–45 and 89–93, respectively, to the data latch 150, which may include a plurality of gated storage flip-flops or other data storage circuitry. Data in the data latch may be updated in correspondence with signals on the output lines 39–45 and 89–93 only when a logic 0 level T5 timing pulse appears on the line 222 and is inverted to a logic 1 level $\overline{T5}$ signal on the line 225 by the inverter 223, the output of which is coupled to the gate input of the data latch 150. The T5 gate signal is shown in FIG. 3 and it is developed in a manner which is subsequently described. The output from the data latch 150 is supplied on the output lines 155 to remote data processing equipment (not shown), when the equipment is actuated to receive it by a strobe pulse sent from the keyboard.

The circuitry of the present invention includes a modulus 2 counter 172 the output of which is coupled to the input of a strobe permit flip-flop 162 which in turn has its output coupled to the input of a strobe flip-flop 164 which controls the production of the strobe pulse. The flip-flops 162 and 164 are both D type; or delay type, bistable flip-flops. They both have a Q and $\overline{Q}$ output terminals, a D input terminal, a $C_p$, or trigger, pulse terminal, a C, or clear, terminal and an S, or set, terminal (not shown). In a D type flip-flop the Q output terminal assumes the logic level of the D input terminal following the application of a logic 1 signal on the $C_p$ terminal; while the $\overline{Q}$ output terminal assumes the logical inverse of this signal. Thus, if a logic 1 level is supplied to the D terminal, the Q output terminal will change to a logic 1 level, or it will remain at a logic 1 level if it is already at this level, upon the occurrence of a logic 1 signal on the $C_p$ terminal. Similarly, the Q output terminal will change to a logic 0 level, or it will remain at a logic 0 level if it is already at this level, upon the occurrence of a logic 1 level trigger signal on the $C_p$ terminal if the D input is at a logic 0 level.

Figure 1D:
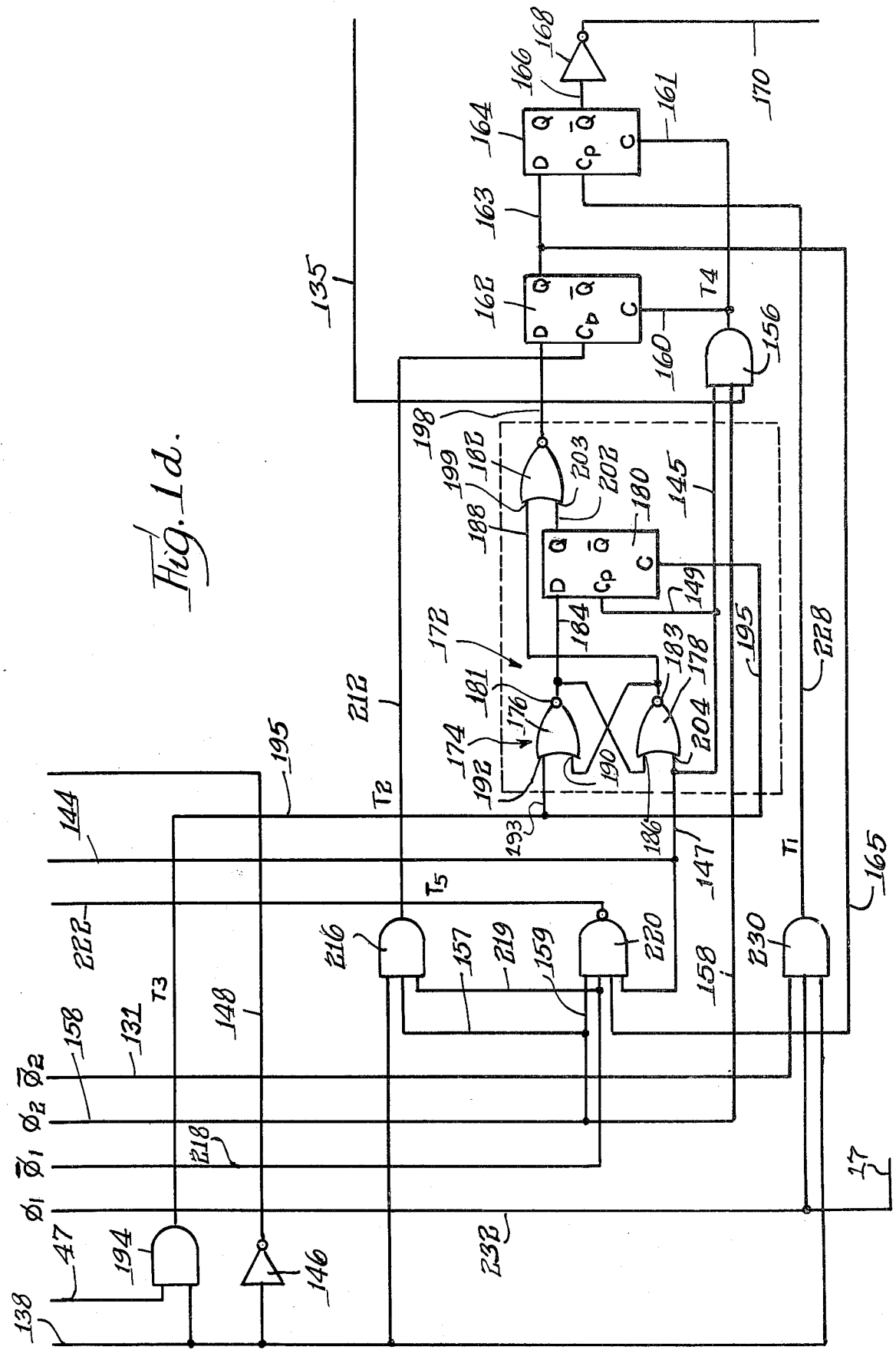

The circuitry for implementing the modulus 2 counter 172 is shown in FIG. 1d. This type of counter counts the first occurrence of an event and produces a logic 1 output signal to indicate this occurrence. The next occurrence of the event results in the counter producing a logic 0 output signal and the counter continues to provide a logic 0 output signal on each subsequent occurrence of the event until the counter is reset to its initial state. The counter 172 includes a flip-flop input stage 174 which cnsists of a pair of cross-coupled NOR gates 176 and 178, a D type flip-flop 180 and an NOR gate output stage 182. The purpose of the modulus 2 counter 172 is to count the number of key switch actuations that occur in a given scan cycle and to provide a logic 1 output signal when one key actuation occurs during a given cycle and a logic 0 output signal when two or more key switches are actuated in the same scan cycle.

The modulus 2 counter is formed by cross-coupling the NOR gates 176, 178 by connecting the output terminal 181 of the NOR gate 176 to the input terminal 186 of the NOR gate 178 while the output terminal 183 of the NOR gate 178 is cross-coupled to the input 190 of the NOR gate 176. The signal for resetting the flip-flop 172 is supplied on the line 193 while the signal for setting the flip-flop 134 is supplied on the line 147. The output terminal 183 of the NOR gate 178 is connected by the line 188 to one input 199 of the NOR gate 182. The output 181 of the NOR gate 176 is connected on the line 184 to the D input terminal of the flip-flop 180. The Q output terminal of the flip-flop 180 is connected on the line 202 to the other input 203 of the NOR gate 182. The $C_p$ input terminal of the flip-flop 180 receives an input signal on the line 149, which is connected to the line 147 that is then connected to the output line 144 of the AND gate 142. At the end of each scan cycle there is an update, or R, time slot during which time the T1, T2 and T3 signals appear in succession as shown on FIG. 3. The output signal from the AND gate 194 is the T3 signal and this is supplied on one line 193 to reset the flip-flop 174 and on the line 195 to the C input of the flip-flop 180 to rest it at the end of each scan cycle. If no key switches were actuated during the last two scan cycles, both the flip-flops 174 and 180 will remain in their reset states and this results in a logic level 1 signal being supplied on the line 188 to the input 199 of the NOR gate 182 while a logic level 1 signal will be supplied to the input 203 of the NOR gate 182. Consequently, the NOR gate 182 will provide a logic 0 output signal on the line 198 to the D input terminal of the strobe permit flip-flop 162, when no key switches have been actuated for two scan cycles.

The output of the shift register 128 will be at a logic level 0 at this time and consequently the output of the inverter 108 on the line 135, (which is coupled to one input of an AND gate 156,) will be at a logic 1 level. A second input of the AND gate 156 receives the $\phi_2$ signal on the line 158 and a third of the AND gate 156 is coupled to the line 145, which is connected to the line 147 that is in turn connected to the output line 144 of the AND gate 142. The "data key" signal on the line 144 is therefore coupled to the AND gate 156 when the $\phi_2$ signal is at a logic 1 level and the actuated key switch was not actuated during the preceding scan cycle. The AND gate 156 therefore acts as a comparison gate and provides a logic 1 T4 signal to the lines 160 and 161, which are respectively coupled to the C or clear input terminals of the flip-flops 162 and 164. As a result, this logic 1 signal will drive the strobe permit flip-flop 162 and the strobe flip-flop 164 to their reset state on the down stroke of a data key switch.

The "data key" signal on the line 144 will also be supplied on the line 147 to the input terminal 204 of the NOR gate 178, resulting in setting of the flip-flop 174. The same "data key" signal on the line 144 is also simultaneously supplied on the line 149 to the $C_p$ input terminal of the flip-flop 180. As a result of this, the flip-flop 174 will be set resulting in a logic 0 signal appearing on the line 188. The flip-flop 180 D-type, however, is constructed to be triggered on the rise of the signal on the $C_p$ terminal so that the state of the Q output terminal of the flip-flop 180 is determined before the flip-flop 174 changes its state. Thus, the flip-flop 180 will not change states upon the actuation of the first key and, therefore, it will still produce a logic 0 output signal on its Q output terminal. Consequently, the lines 188 and 202 will both be at a logic 0 level following the actuation of the first key switch of a scan cycle and the counter 172 is incremented just before the T4 signal on the lines 160, 161 occurs so that output of the NOR gate 182 on the output line 198 goes to a logic 1 level.

Since the T1, T2 and T3 signals occur in the update or R time slot, in succession as shown in FIG. 3, the logic level 1 output signal on the line 198 will not affect the strobe permit flip-flop 162 until the next scan cycle period following the scan cycle during which the flip-flop 174 was reset by the T3 signal. A logic 1 level T2 signal supplied on the line 212 to the $C_p$ input of the strobe during this subsequent scan cycle then sets the strobe permit flip-flop 162 if a logic 1 signal is also present on the line 198 indicating that only a single key switch was depressed during the preceding scan cycle. When the flip-flop 162 is set, a logic 1 signal on the line 163 to the D input terminal of the strobe flip-flop 164. The strobe flip-flop 164 is controlled by the T1 pulse that is supplied on the line 228 to the $C_p$ terminal of the flip-flop 164, and since the logic 1 level signal on the Q output terminal of the strobe permit flip-flop 162 will be transferred into the strobe 164 in the scan cycle following the scan cycle during which the single actuated key switch was depressed, the $\overline{Q}$ output terminal of the flip-flop 164 will then supply a logic 0 level signal on the line 166.

The Q output of the strobe permit flip-flop 162 is supplied on the line 165 to one input of the NAND gate 220. The second input of the NAND gate 220 is supplied with the $\phi_2$ signal on the line 158, a third input of the NAND gate 220 is supplied with the $\overline{\phi_1}$ signal on the line 218 and a fourth input of the NAND gate 220 is supplied with the "key down" down signal on the line 144. The output of the NAND gate 220 generates the T5 gate signal for the data latch 150, as previously mentioned. If only one key switch has been actuated during the first scan cycle, the output of the NOR gate 182 remains at a logic 1 level for the entire first scan cycle, and this logic 1 level signal is couled to the D input of the strobe permit flip-flop 162 on the line 163. The logic 1 level signal on the line 165 is transformed into a logic 0 T5 signal on the line 222 and a logic 1 level $\overline{T5}$ signal on the line 225 during the second half of the $\phi_2$ signal when the $\phi_1$ signal has dropped to a logic 0 level. Thus, the information provided by the first key switch actuation will be transferrred into the data latch 150, and each succeeding scan will load the same count into the data latch 150 as long as a single key switch remains actuated.

If a second key switch is actuated during the first scan cycle, the flip-flop 174 remains in its set state, but a second trigger pulse is supplied on the line 149 to the $C_p$ input terminal of the flip-flop 180. The line 184 to the D input terminal to flip-flop 180 would now be at a logic 1 level and the Q output terminal of the flip-flop 180 would thus change to a logic 1 level. The logic 1 signal on the line 202 then provides a logic 0 level signal at the output of NOR gate 182 on the line 198. Each subsequent depression of a key switch during the same scan cycle can then produce no further change in the state of the flip-flops 174 and 180, and until the counter 172 is reset and the line 198 will, therefore, remain at a logic 0 level. Data will thus be transferred into the data latch 150 from the binary counters 14 and 16 only when a single key switch is actuated during two consecutive scan cycles.

The strobe permit flip-flop 162 and the strobe flip-flop 164 are controlled by the T2 signal on the $C_p$ input terminal of the flip-flop 162 and the T1 signal on the $C_p$ terminal of the flip-flop 164, as previously mentioned. The T1 signal is derived from the AND gate 230 which has three input terminals. One of these input terminals is supplied by the signal on the line 138 which is derived from the decoder 136 that signifies that an update or R time slot has been reached. A second input terminal is supplied the $\phi_1$ signal on the line 232 while the third input terminal is supplied the $\overline{\phi_2}$ signal on the line 131. Thus, the T1 signal occurs for each update time slot R during the first half of the $\phi_1$ signal when the $\phi_2$ signal is at a logic 0 level. The T2 signal is derived from the AND gate 216 which is also a three input terminal AND gate. One of the input terminals of the AND gate 216 is supplied by the line 138, the second input receives the $\phi_2$ signal on the line 158 and the third input is supplied by the line 219, which is connected to the line 218 to provide the $\overline{\phi_1}$ signal. Thus, the T2 signal occurs in each update time slot during the last half of the $\phi_2$ signal subsequent to the T1 signal.

The T3 signal which follows the T1 and T2 signals is provided by the AND gate 194 which is a two input AND gate. One input is also connected to the line 138, while the other input is connected to the line 47 which is supplied with the $\phi_4$ signal from the timing generator 12. Thus, the flip-flops 174 and 180 are reset during an update time slot of a first scan cycle by the T3 signal, the strobe permit flip-flop 162 is updated during the update time slot of the next scan cycle and the strobe flip-flop 164 is updated during the update time slot of the second scan cycle that follows the resetting of the flip-flops 174 and 180.

When one key switch has been depressed during both a first scan cycle and a second or subsequent scan cycle, the strobe flip-flop 164 provides a logic level 0 signal on the line 166 as previously mentioned. This signal will be inverted by the inverter 168 and is supplied at a logic level 1 output strobe signal on the line 170 to external data processing equipment (not shown), to provide for the transfer of data on the output lines 155 from the data latch 150. When two key switches are depressed during the first scan cycle, the count of the counter 172 is 0 when the T2 signal appears on the $C_p$ terminal of the strobe permit flip-flop 162 and, consequently, the strobe flip-flop 164 will not be set to produce the strobe pulse. If only one key switch was depressed during the first scan cycle but a second key happens to be depressed during the second and subsequent scan cycle, both the strobe permit flip-flop 162 and the strobe flip-flop 164 are reset by the logic 1 level signal that is provided on the lines 160 and 161 by the AND gate 156. The T4 reset signal on the lines 160 and 161 is initiated during the last half of the $\phi_1$ signal for the key time slot for the particular switch. Therefore, the flip-flop 162 is reset to a 0 before the T5 signal can be produced in order to prevent new data from being transmitted into the data latch 150. Thus, the actuation of two or more key switches in any two successive scans results in an error data condition which is not loaded into the data latch 150 nor is it trasmitted to the remote processing equipment. Actuation of two key switches in such a short time period is generally regarded as the result of a typing error.

If the second data key switch is actuated while the first data key switch remains actuated, but the actuation of the second key switch occurs at least two scan cycles later than the actuation of the first data key switch, the logic 1 level on the Q output terminal of the strobe permit flip-flop 162 will be transferred into the strobe flip-flop 164 on the line 163 before the T4 reset pulse is generated by the second depressed key switch and a strobe pulse will be produced on the line 170 that will cause a transfer of the data in the data latch 150 to the remote processing equipment. If the first key is then subsequently released while the second key remains depressed, the modulus key counter 172 will be incremented to a 1 count at the end of a first scan cycle and this will first set the strobe permit flip-flop 162 and then the strobe flip-flop 164 at the end of the second scan cycle. Therefore, the second actuated key switch will be read upon release of a first actuated key switch if the second key switch remains actuated for two consecutuve scan cycles following de-actuation of the first key switch providing the actuation of the second key switch occurs at least two scan cycle times after the actuation of the key switch. The actuation of two keys in succession when the actuation is spaced this far apart in time is generally regarded as a normal typing occurrence.

I claim:

1. A keyboard comprising a plurality of selectively operable matrix elements each having an actuated state and an unactuated state, output means for scanning and sensing the state of each of said matrix elements in a sequential cyclic manner, memory means coupled to said output means for temporarily storing the sensed state of each of said matrix elements, output indicating means coupled to said output means for receiving a first signal representative of the state that the matrix element being scanned is in during the current scan cycle and coupled to said memory means for receiving a second signal representative of the state that the matrix element being scanned was in during the previous scan cycle, said output indicating means being constructed to provide an output data representation only when said first signal is representative of an actuated state of said scanned matrix element and said second signal is representative of an unactuated state of said scanned matrix element, data storage means coupled to said output means for storing data codes that are coupled to said data storage means for said output means in accordance with the actuation of said matrix elements and logic circuit means coupled to said output indicating means, to said data storage means and to said output means, which is responsive to said output data representation and is constructed to supply a gate signal to said data storage means for gating a selected data code associated with an actuated matrix element into said data storage means following the actuation of a matrix element during a first scan cycle only if said matrix element is the only matrix element that is actuated during either said first scan cycle or during a second scan cycle, which immediately succeeds said first scan cycle, and to provide only one transmission of the resulting stored data code in said data storage means to external data processing means.

2. A keyboard comprising a plurality of selectively operable matrix elements each having an actuated state and an unactuated state, output means for scanning and sensing the state of each of said matrix elements in a sequential cyclic manner, memory means coupled to said output means for temporarily storing the sensed state of each of said matrix elements, output indicating means coupled to said output means for receiving a first signal representative of the state that the matrix element being scanned is in during the current scan cycle and coupled to said memory means for receiving a second signal representative of the state that the matrix element being scanned was in during the previous scan cycle, said output indicating means being constructed to provide an output data representation only when said first signal is representative of an actuated state of said scanned matrix element and said second signal is representative of an unactuated state of said scanned matrix element, data storage means coupled to said output means for storing data codes that are coupled to said data storage means from said output means in accordance with the actuation of said matrix elements, first and second bistable storage means, each being capable of assuming a first or a second state, strobe generator means coupled to said second bistable storage means and responsive thereto to produce a strobe output pulse when said second storage means is in its second state to external data processing means which are coupled to said data storage means in order to control the transfer of data codes stored in said data storage means to the data processing means, gate signal means coupled to a said first bistable storage means and responsive thereto to couple a gate output pulse to said data storage means, thereby gating a data code into said data storage means, when said first bistable means is in its second state, reset means coupled to said output indicating means and to said first and second bistable storage means coupled to receive said output data representation and constructed to drive both said first and second bistable storage means into their first states in response thereto and trigger means coupled to said output means and constructed to drive said first bistable means into its second state during a first scan cycle only if a single matrix element is actuated during said first scan cycle and during a second scan cycle, which immediately succeeds said first scan cycle, and to subsequently drive said second bistable means into its second state during said second scan cycle.

3. A keyboard as claimed in claim 2 wherein said trigger means comprises a modulus 2 counter which is coupled to said output means and to said first bistable means and provides a triggering signal to said first bistable means only when a single matrix element actuation is counted by said counter during a scan cycle.

4. A keyboard comprising a switching matrix having a plurality of drive wires and a plurality of sense wires arranged to form a plurality of junctures where signal coupling between said drive wires and said sense wires can occur, scan means for scanning said drive wires and said sense wires in timed relation, a plurality of manually operable switches for selectively coupling said drive wires and said sense wires at their junctures for coupling actuation pulses therebetween, a memory device having an input and an output means sequentially coupling said sense wires to the input of said memory device to receive said actuation pulses when present on the respective sense wires, a pulse generator, coupling means for coupling said actuation pulses as input signals to said memory device and the output signals of said memory device to said pulse generator, said pulse generator comparing therein said input signals and said output signals to affect a pulse output signal on the first scan of said sense wires when a switch at a given junction is actuated, said pulse output signal being produced when said input and output signals are uniquely different and thereafter being prevented when said input and output signals are the same, data storage means coupled to said scan means for storing data codes that are coupled to said data storage means from said scan means, in accordance with the actuation of said switches and logic circuit means coupled to said pulse generator, to said data storage means and to said scan means which is repsonsive to said pulse output signal and is constructed to supply a gate signal to said data storage means for gating selected data code associated with an acuated switch into said data storage means following the actuation of a switch during a scan cycle only if said switch is the only switch that is actuated during either said first scan cycle or during a second scan cycle, which immediately succeeds said first scan cycle, and to provide only one transmission of the resulting stored data code in said data storage means to an external data processing means.

5. A keyboard comprising a switching matrix having a plurality of drive wires and a plurality of sense wires arranged to form a plurality of junctures where signal coupling between said drive wires and said sense wires can occur, scan means for scanning said drive wires and said sense wires in timed relation, a plurality of manually operable switches for selectively coupling said drive wires and said sense wires at their junctures for coupling actuation pulses therebetween, a memory device having an input and a gate means sequentially coupling said sense wires to the input of said memory device to receive said actuation pulses when present on the respective sense wires, a pulse generator, a coupling means for coupling said actuation pulses as input signals to said memory device and output signals of said memory device to said pulse generator, said pulse generator comparing therein said input signals and said output signals to affect a pulse output signal on the first scan of said sense wires when a switch at a given junction is actuated, said pulse output signal being produced when said input and output signals are different and thereafter being prevented when said input and output signals are the same, data storage means coupled to said scan means for storing data codes that are coupled to said data storage means from said scan means in accordance with the actuation of said switches, first and second bistable storage means, each being capable of assuming a first or a second state, strobe generator means coupled to said second bistable storage means and responsive thereto to produce a strobe output pulse when said second storage means is in its second state to external data processing means which are coupled to said data storage means in order to control the transfer of data codes stored in said data storage means to the data processing means, gate signal means coupled to said first bistable storage means and responsive thereto to couple a gate output pulse to said data storage means, thereby gating a data code in said data storage means when said first bistable means is in its second state, reset means coupled to said pulse generator and to said first and second bistable storage means constructed to receive the said pulse output signal and to drive both said first and second bistable storage means into their first states in response thereto and trigger means coupled to said output means and construsted to drive said first bistable means into its second state during a first scan cycle only if a single switch is actuated during said first scan cycle and during a second scan cycle, which immediately succeeds said first scan cycle, and to subsequently drive said second bistable means into its second state during said second scan cycle.

6. A keyboard as claimed in claim 5 wherein said trigger means comprises a modulus 2 counter which is coupled to said output means and to said first bistable means and provides a triggering signal to said first bistable means only when a single switch actuation is counted by said counter during a scan cycle.

7. A keyboard encoder circuit for generating a unique signal representing the actuation of a key in the keyboard, including: scanning means for serially scanning the keys of the keyboard in successive scan cycles to provide in each scan cycle unique signals serially generated which identify the state of actuation of each key, a storage device for storing during each scan cycle said unique signals which represent the actuation states of the keys of the keyboard during the scan cycle, and for providing serially generated output signals during the next scan cycle representing the unique signals stored during the previous scan cycle, said output signals being provided in time coincidence with said unique signals generated by said scanning means during said next scan cycle, so that a stored data signal for a key is reproduced at the same time that the scanning means provides a new unique signal for that same key, and gate means provided with said serially generated unique signals and said output signals from said storage device for generating a key-detect signal upon receipt of both a unique signal representing a key in an actuated state during a scan cycle and an output signal from said storage device representing the same key in a non-actuated state during the previous scan cycle, so as to generate key-detect signals only upon the intial actuation of keys in the keyboard, data storage means coupled to said scanning means for storing data codes that are coupled to said data storage means from said scanning means in accordance with the actuation of said keys and logic circuit means coupled to said gate means, to said data storage means and to said scanning means which is responsive to said key-detect signal and is constructed to supply a gate to said data storage means for gating a selected data code associated with an actuated key into said data storage means following the actuation of a key during a first scan cycle only if said key is the only key that is actuated during either said first scan cycle or during a second scan cycle, which immediately succeeds said first scan cycle, and to provide only one transmission of the resulting stored data code in said data storage means to external data processing means 8. A keyboard encoder circuit for generating a signal representing the actuation of a key in the keyboard, including: scanning means for serially scanning the keys of the keyboard in successive scan cycles to provide in each scan cycle unique signals serially generated which identify the state of actuation of each key, a storage device for storing during each scan cycle unique signals representing the actuation states of the keys of the keyboard during the scan cycle, and for providing serially generated output signals during the next scan cycle representing the unique signals stored during the previous scan cycle, said output signals being provided in time coincidence with the unique signals generated by said scanning means during said next scan cycle, so that a stored unique signal for a key is reproduced at the same time that the scanning means provides a new unique signal for that same key, and gate means provided with said serially generated unique signals and said output signals from said storage device for generating a key-detect signal upon receipt of both a unique signal representing a key in an actuated state during a scan cycle and an output signal from said storage device representing the same key in a nonactuated state during the previous scan cycle so as to generate key-detect signals only the initial actuation of keys in the keyboard, data storage means coupled to said scanning means for storing data codes that are coupled to said data storage means from said scanning means in accordance with the actuation of said keys, first and second bistable storage means, each capable of assuming a first and second state, strobe generator means coupled to said second or a bistable storage means and responsive thereto to produce a strobe output pulse when said second storage means is in its second state to external data processing means which are coupled to said data storage means in order to control the transfer of data codes stored in said data storage means to the data processing means, gate signal means coupled to said first bistable storage means and responsive thereto to produce a gate output pulse to said data storage means, thereby gating a data code into said data storage means when said first bistable means is in its second state, reset means coupled to said gate means and to said first and second bistable storage means coupled to receive the said key-detect signal and to drive both said first and second bistable storage means into their first states in response thereto and trigger means coupled to said scanning means and constructed to drive said first bistable means into its second state during a first scan cycle only if a single key is actuated during said first scan cycle and during a second scan cycle which immediately succeeds said first scan cycle, and to subsequently drive said second bistable means into its second state during said second scan cycle.

9. A keyboard encoder circuit as claimed in claim 8 wherein said trigger means comprises a modulus 2 counter which is coupled to said scanning means and to said first bistable means and provides a triggering signal to said first bistable means only when only a single key actuation is counted by said counter during a scan cycle.

10. A keyboard encoder for generating a unique signal for each new key depressed in a keyboard having a plurality of keys, whether or not a previously depressed key still remains depressed, comprising: scanning means for serially scanning each key of the keyboard along a predetermined scan pattern to produce a signal information train comprising one time interval for each of the keys of the keyboard, and containing within each such time interval a signal if the corresponding key is depressed, a comparison circuit having at least first and second input terminals and an output for generating an output signal whenever a signal appears on its first input terminal and not on its second input terminal, a storage device having a storage capacity at least sufficient to store a number of signals equal to the number of data encoded keys of the keyboard, the output of said storage device being electrically connected to the second input terminal of the comparison circuit, first circuit means coupling said scanning means to said storage device for supplying said signal information train to said storage device to store therein information signals corresponding to one complete scan of the keyboard, second circuit means coupling said scanning means to the first input terminal of said comparison circuit for supplying said signal information train serially to said first input terminal, and means for synchronously advancing out of said storage device to the second input terminal of the comparison circuit the information train then stored in the storage device from the previous scan of keyboard, the output terminal on said comparison circuit generating a key-detect signal when said first input terminal receives a signal from the present scan of the keyboard while the second input terminal fails to receive a signal from the corresponding key in the previous scan, data storage means coupled to said scanning means for storing data codes that are coupled to said data storage means from said scanning means in accordance with the actuation of said keys and logic circuit means coupled to said comparison circuit, to said scanning means and to said data storage means which is responsive to said key-detect signal and is constructed to supply a gate signal to said data storage means for gating a selected data code associated with an actuated key into said data storage means following the actuation of a key during a first scan cycle only if said key is the only key that is actuated during either said first scan cycle or during a second scan cycle, which immediately succeeds said first scan cycle, and to provide only one transmission of the resulting stored data code in said data storage means to external data processing means.

11. A keyboard encoder for generating a unique signal for each new key depressed in a keyboard having a plurality of keys, whether or not a previously depressed key still remains depressed, comprising: scanning means for serially scanning each key of the keyboard along a predetermined scan pattern to produce a signal information train comprising one time interval for each of the keys of the keyboard, and containing within each such time interval a signal if the corresponding key is depressed, a comparison circuit having at least first and second input terminals and an output terminal for generating an output signal whenever a signal appears on its first input terminal and not on its second input terminal, a storage device having a storage capacity at least sufficient to store a number of signals equal to the number of data encoded keys of the keyboard, the output of said storage device being electrically connected to the second input terminal of the comparison circuit, first circuit means coupling said scanning means to said storage device for supplying said signal information train to said storage device to store therein information signals corresponding to one complete scan of the keyboard, second circuit means coupling said scanning means to the first input terminal of said comparison circuit for supplying said signal information train serially to said first input terminal, and means for synchronously advancing out of said storage device to the second input terminal of the comparison circuit the information train then stored in the storage device from the previous scan of the keyboard, the output terminal on said comparison circuit generating a key-detect signal when said first input terminal receives a signal from the present scan of the keyboard while the second input terminal fails to receive a signal from the corresponding key in the previous scan, data storage means coupled to said scanning means for storing data codes that are coupled to said data storage means from said scanning means in accordance with the actuation of said keys, first and second bistable storage means, each being capable of assuming a first or a second state, strobe generator means coupled to said second bistable storage means and responsive thereto to produce a strobe output pulse when said second storage means is in its second stage to external data processing means which are coupled to said data storage means in order to control the transfer of data stored in said data storage means to the data processing means, gate signal means coupled to said first bistable storage means and responsive thereto to couple a gate output pulse to said data storage means thereby gating a data code into said data storage means when said first bistable means is in its second state, reset means coupled to said comparison circuit and to said first and second bistable storage means coupled to receive said key-detect signal and to drive both said first and second bistable storage means into their first states in response thereto and trigger means coupled to said scanning means and constructed to drive said first bistable means into its second state during a first scan cycle only if a single key is actuated during said first scan cycle and during a second scan cycle, which immediately succeeds said first scan cycle, and to subsequently drive said second bistable means into its second state during said second scan cycle.

12. A keyboard encoder as claimed in claim 11 wherein said trigger means comprises a modulus 2 counter which is coupled to said scanning means and to said first bistable means and provides a triggering signal to said first flip-flop when only a single key actuation is counted by said counter during a scan cycle.

13. A keyboard comprising a matrix of actuable elements each having an actuated state and an unactuated state, sensing means for sensing the state of each of the devices in the matrix, a storage device for temporarily storing the signals that are sensed by said sensing means, comparison means coupled to receive a first signal which is representative of the state of an actuated element during a second keyboard cycle and to said storage device which is representative of the state of said element during a first keyboard cycle which immediately preceded said second keyboard cycle, said comparison means being constructed to provide a key-detect signal only when said first and second signals do not compare, data storage means coupled to said sensing means for storing data codes that are coupled to said data storage means from said sensing means in accordance with the actuation of said actuable elements and logic circuit means coupled to said comparison means and to said data storage means which is responsive to said keydetect signal and is constructed to supply a gate signal to said data storage means for gating a selected data code associated with an actuated element into said data storage means follwing the actuation of an element during said first scan cycle only if said element is the only element that is actuated during either said first or said second scan cycle and to provide only one transmission of the resulting stored data code in said data storage means to external data processing means.

14. A keyboard comprising a matrix of actuatable elements each having an actuated state and an unactuated state, sensing means for sensing the state of each of the devices in the matrix, a storage device for temporarily storing the signals that are sensed by said sensing means, comparison means coupled to receive a first signal which is representative of the state of an actuated element during a second keyboard cycle and to said storage device which is representative of the state of said element during a first keyboard cycle which immediately proceded said second keyboard cycle, said comparison means being constructed to provide a key-detect signal only when said first and second signals do not compare, data storage means coupled to said sensing means for storing data codes that are coupled to said data storage means from said sensing means in accordance with the actuation of said actuable elements, first and second bistable storage means, each being capable of assuming a first or a second state, strobe generator means coupled to said second bistable storage means and responsive thereto to produce a strobe output pulse when said second storage means is in its second state to external data processing means which are coupled to said data storage means in order to control the transfer of data codes stored in said data storage means to the data processing means, gate signal means coupled to said first bistable storage means and responsive thereto to couple a gate output pulse to said data storage means, thereby gating a data code into said data storage means when said first bistable means is in its second state, reset means coupled to said output indicating means and to said first and second bistable storage means coupled to receive said key-detect signal and to drive both said first and second bistable storage means into their first states in response thereto and trigger means coupled to said sensing means and constructed to drive said first bistable means into its second state during a first scan cycle only if a single element is actuated during said first scan cycle and during a second scan cycle, which immediately succeeds said first scan cycle, and to subsequently drive said second bistable means into its second state during said second scan cycle.

15. A keyboard as claimed in claim 14 wherein said trigger means comprises a modulus 2 counter which is coupled to said sensing means and to said first bistable means and provides a triggerig signal to said first bistable means only when a single element actuation is counted by said counter during a scan cycle.

* * * * *

UNITED STATES PATENT OFFICE
CERTIFICATE OF CORRECTION

Patent No. 3,978,474　　　　　Dated　　August 31, 1976

Inventor(s) Keith Allen Engstrom

It is certified that error appears in the above-identified patent and that said Letters Patent are hereby corrected as shown below:

IN THE CLAIMS:

Column 13, Line 16, "repsonsive" should read -- responsive --.
Column 14, Line 4, "construsted" should read -- constructed --.
Column 14, Line 49, after the word "gate", add the word -- signal --.
Column 15, Line 15, after the word "only", add the word -- upon --.
Column 16, Line13, after the word "of", add the word -- the --.
Column 17, Line 37, "actuable" should read -- actuatable --.
Column 17, Line 53, "actuable" should read -- actuatable --.
Column 18, Line 24, "actuable" should read -- actuatable --.
Column 18, Line 55, "triggerig" should read -- triggering --.

IN THE SPECIFICATION

Column 1, Line 36, "Portection" should read -- Protection --.
Column 5, Line 12, "th" should read -- the --.
Column 6, Line 8, "ae" should read -- are --.
Column 6, Line 14, "resiistor" should read -- resistor --.
Column 6, Line 65, "isdetected" should read -- is detected --.
Column 11, Line 2, "trasmitted" should read - transmitted --.
Column 11, Line 24, "secutuve" should read -- secutive --.

Signed and Sealed this

Eighth Day of February 1977

[SEAL]

Attest:

RUTH C. MASON
Attesting Officer

C. MARSHALL DANN
Commissioner of Patents and Trademarks